United States Patent

[11] 3,558,931

[72] Inventor Anthony J. Chernoske
Baltimore, Md.
[21] Appl. No. 719,085
[22] Filed Apr. 5, 1968
[45] Patented Jan. 26, 1971
[73] Assignee Westinghouse Electric Corporation
Pittsburgh, Pa.
a corporation of Pennsylvania

[54] FLIP-FLOP CIRCUIT PARTICULARLY FOR INTEGRATION
2 Claims, 2 Drawing Figs.

[52] U.S. Cl. .......... 307/291,
307/215, 307/289, 328/206
[51] Int. Cl. .......... H03k 3/12
[50] Field of Search .......... 307/289,
291, 247, 290; 328/206

[56] References Cited

UNITED STATES PATENTS 3,398,300 8/1968 Yu .......... 307/247

OTHER REFERENCES

Van Ligten et al., Nerem Record, 1965, p. 176,177 Microelectronics II (Lecture)

*Primary Examiner*—Donald D. Forrer
*Assistant Examiner*—David M. Carter
*Attorneys*—F. Shapoe, C. L. Menzemer and Gordon H. Telfer

ABSTRACT: A flip-flop circuit is provided with cross-coupling using an extra transistor between an input element and a circuit point directly responsive to the inverted signal of the opposite stage. Greater speed, symmetry and ease of formation in integrated circuits are achieved.

PATENTED JAN 26 1971 3,558,931

WITNESSES:
Bernard R. Giegue
Leon M. Garman

INVENTOR
Anthony J. Chernoske

BY Gordon H. Telfer
ATTORNEY

FLIP-FLOP CIRCUIT PARTICULARLY FOR INTEGRATION

BACKGROUND OF THE INVENTION

1. Field of the Invention

The invention relates to solid state electronic circuitry, particularly to semiconductor circuits capable of operation as flip-flops and suitable for incorporation in integrated circuits.

2. Description of the Prior Art

Flip-flop circuits are required that provide at the outputs of each of the two stages signals representative of different logic levels such as a logic "ONE" and a logic "ZERO" in binary systems. It is desirable that each output synchronously switch to the inverse of the opposite stage output.

The usual technique for satisfying the above requirement is by direct cross-coupling from an input to the opposite output, sometimes called "external cross-coupling." Several disadvantages result. In this scheme one side of the flip-flop must switch completely before the other side begins to switch resulting in unsymmetrical switching times. Grounding of the outputs may force an undesired state change requiring circuit elements for buffering. In flip-flops which utilize stored charge, there is a specific and finite amount of charge stored on the charge storage capacitors. Thus for a finite period of time an input may receive a ZERO signal but may not retain that signal before the output reaches a ONE state level and the flip-flop is said not to be latched.

In many present flip-flops each stage has between the output and the individual transistor element that provides the actual inversion or phase splitting function, a network of elements for providing control over the signal level and polarity at the output to meet the requirement of the types of loads with which the flip-flop may be used. Such networks impose additional problems in achieving fast synchronous switching when external cross-coupling is used.

Design of circuits for formation within semiconductor integrated circuits imposes additional requirements in that effort must be made to avoid the necessity of individual device elements that are not readily achieved through conventional fabrication procedures. Preferably all transistors in the circuit should require only the same structural and performance characteristics so that processing is not complicated.

SUMMARY OF THE INVENTION

Among the objects of the present invention are to provide a flip-flop circuit with cross-coupling for fast symmetrical switching, with exact latching conditions, and which is amenable to integration by straight-forward integrated circuit technology.

These and other objects and advantages are achieved by employing cross-coupling between the input of one stage and a point directly responsive to the inverter or phase splitter element of the other stage and without imposing special requirements on the phase splitter transistors. For this purpose an additional transistor is provided in the cross-coupling branch. Its primary function is to prevent both outputs from having the same state by presenting a higher threshold voltage at the input. The higher gate threshold permits the use of the collector of the phase splitting transistor for a reference point.

Additionally, it is preferred in those instances in which the flip-flop includes a signal level and polarity control network between the phase splitter element and the output to employ a buffer element of suitable resistance to avoid adverse effects of grounding the output. This resistor should be of sufficient magnitude to prevent an induced logic "ZERO" the output from reducing the potential at the phase splitter collector to a value below the gate threshold voltage.

DESCRIPTION OF THE PREFERRED EMBODIMENTS

The invention will be described primarily with reference to transistor-transistor logic (TTL) circuits. Such circuits are well known and a description of their general nature may be found elsewhere.

Figure 1:
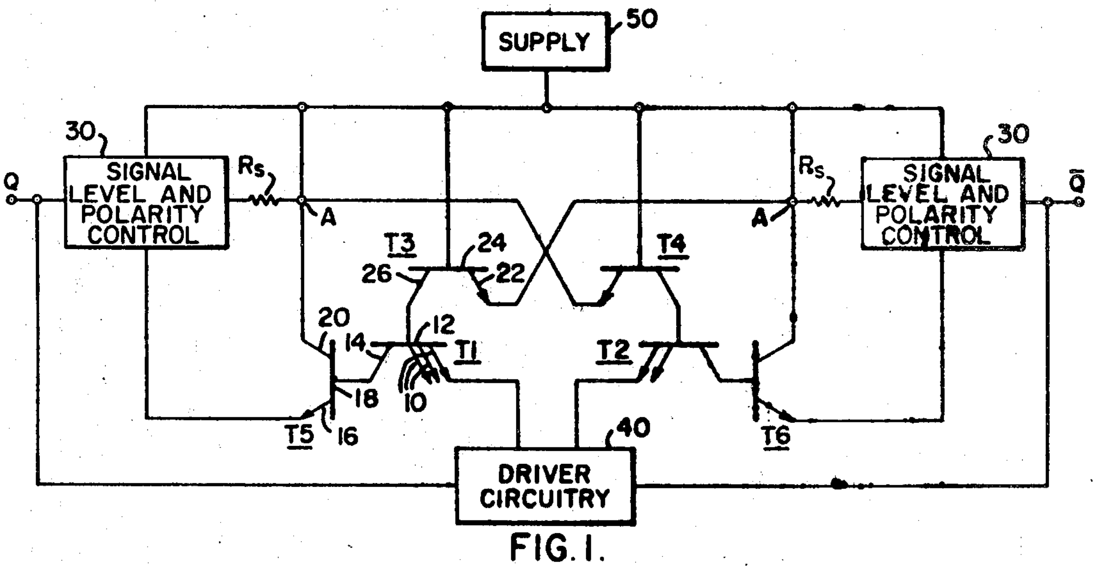
FIGS. 1 and 2 are circuit schematics of embodiments of the present invention.

FIG. 1 shows a generalized TTL flip-flop circuit embodying the invention. As with flip-flops generally the right and left-hand portions are each a logic gate of the same essential configuration. Referring to the left-hand portion of FIG. 1 an input means to receive input signals is provided by the transistor T1 having a plurality of emitters 10 to receive the individual input signals, as well as collector 14. Transistor T1 is responsive to input signals of suitable magnitude, polarity and duration to apply to the base 18 of the transistor T5, through connection to the collector 14 of T1, a switching signal sufficient to change the state of T5, such as by driving it into or out of saturation. Transistor T5 also has an emitter 16 and collector 20 connected, through other elements to be described to output Q. Transistors T2 and T6 in the right-hand stage correspond, respectively, to transistors T1 and T5.

The output of each inverter or phase splitting element T5 and T6 at its collector may then be subjected to the influence of a signal level and polarity control network 30 designed for the particular loads which are to be driven by the flip-flop. Driver circuitry 40 is connected to at least one of the inputs of each of the input transistors T1 and T2 as well as normally to the outputs Q and $\overline{Q}$ and a voltage supply is so connected to the elements as shown usually with voltage dropping resistors in the branches to each of the elements. Suitable driver circuitry, signal level and polarity control circuitry and supplies may be selected in accordance with present TTL practice.

As was above discussed, in the prior art cross-coupling is commonly achieved by direct connection between the output Q and one of the inputs 10 to transistor T2 and from the output $\overline{Q}$ to one of the inputs to transistor T1 with the attendant disadvantages. Here, however, cross-coupling is achieved from each of the transistors T1 and T2 to a circuit point A directly responsive to the state of the individual phase splitter transistors T5 and T6. Furthermore, so that this form of "internal" cross-coupling does not impose extra requirements on the structure and characteristics of T5 and T6 that would make integration difficult, transistors T3 and T4 are each provided in one of the cross-coupling branches so that all the transistors may be of like characteristics and may be formed by straight-forward integrated circuit techniques. Transistor T3 has an emitter 22 connected to circuit point A of the right hand stage, collector 26 connected to the base 12 of T1 and base 24 connected to the supply. Connections for the right hand element T4 are a mirror image of those for T3.

Each stage also has as an optional but preferred feature a resistive element $R_S$ coupled between the circuit point A and the signal level and polarity control network to act as a buffer element. This resistor may typically be of a value of about 200 ohms so that while the present invention requires the four additional elements T3, T4 and two resistors $R_S$ they provide sufficient improvement in performance to offset the disadvantage of requiring additional space in the integrated circuit and they do not complicate the integrated circuit fabrication process from that normally employed using, for example, epitaxial growth and selective diffusion operations of which full description is readily available elsewhere.

By reason of the internal cross-coupling provided by this invention, a waiting period is no longer required before the output turning on responds to the change of state of the output turning off. Thus each output is essentially independent of the other, that is, they are buffered.

Furthermore in the internally cross-coupled flip-flop the slave flip-flop, i.e., when driven by the driver circuitry, will latch irrespective of the output states. Thus, the internally cross-coupled flip-flop can drive output capacitances in excess of one microfarad while the externally cross-coupled flip-flop is limited to about 800 picofarads maximum output capacitance. Automatic reduction in the turnon time of these stages results from internal cross-coupling.

Internal cross-coupling without the additional transistors T3 and T4 is not preferred because if direct connection were employed the phase splitting transistors in the slave flip-flop must have a saturation voltage less than 0.2 volts at 125° C. with base current of 0.5 milliamperes and collector current of 6 milliamperes in order to prevent the gate threshold voltage from being reduced to a low level. Such performance requirements would impose added difficulties on processes which would require more careful control and might result in lower integrated circuit yields.

Figure 2:
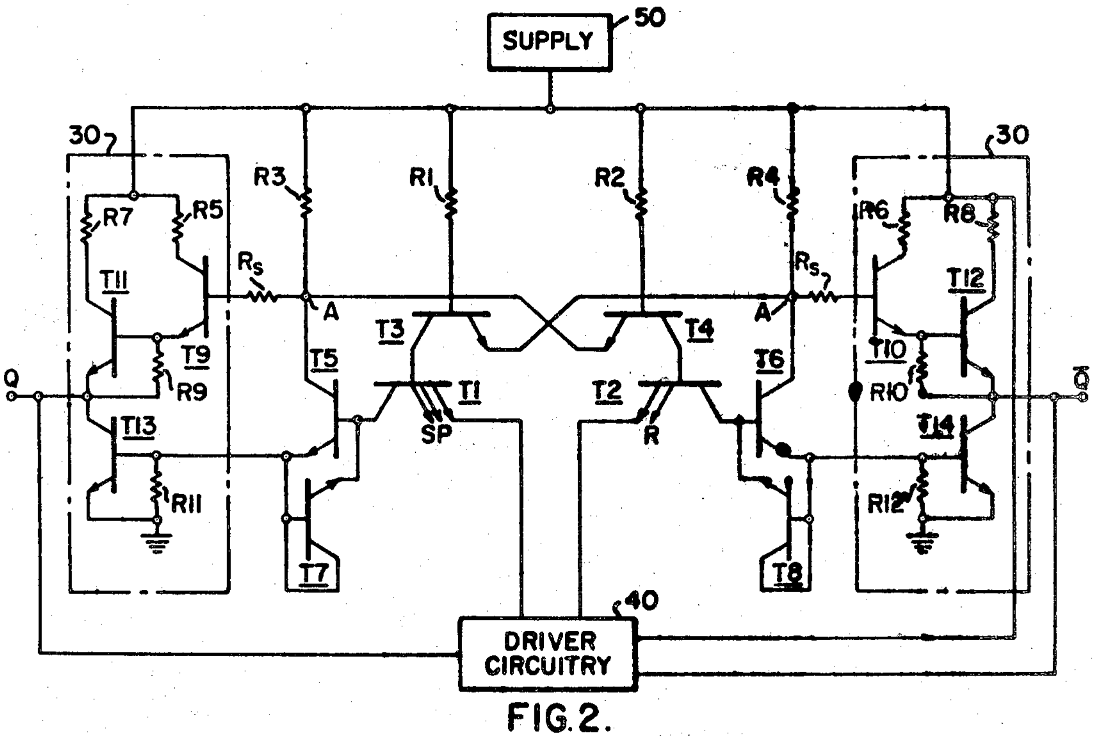

The invention is generally applicable to flip-flop circuits, particularly flip-flop circuits employing TTL logic such as is presently produced in integrated circuit form. FIG. 2 shows a more specific example of the invention employing transistors T1 through T6 and resistors $R_S$ as in FIG. 1. Resistors R1 through R8 set voltage levels of the various elements with respect to the source 50. An example of the signal level and polarity control network 30 for each stage is shown in FIG. 2 including in the left-hand side transistors T9, T11 and T13 with coupling resistive elements R9 and R11 connected in a manner as is presently practiced in TTL circuits intended for bidirectional output. Transistor T7 is for the purpose of providing the effect of a diode, because its emitter base junction is shorted, across the base and emitter of T5 but in the reverse polarity direction for speeding up the switching action of T5. Transistor T7 is an optional feature that may be employed in circuits of this type. In the right-hand stage transistors T8, T10, T12 and T14 and resistors R10 and R12 correspond, respectively to transistors T7, T9, T11 and T13 and resistors R9 and R11 of the left-hand stage. As opposed to like circuits that employed external cross-coupling, the circuits of FIG. 2 have provided clock frequency in excess of 50 megahertz compared with 35 megahertz previously.

Driver circuitry suitable for use in inventions like that of FIG. 2 are well known in accordance with TTL practice and may be found elsewhere.

The inputs S, P and R of transistors T1 and T2 are so designated as a result they represent, in accordance with standard practice, the asynchronous inputs to the flip-flop called set, preset and reset.

While the invention has been shown and described in a few forms only it will be apparent that various changes and modifications may be made without departing from the spirit and scope thereof.

I claim:

1. Semiconductor apparatus capable of operation as a flip-flop comprising:

first input means to receive input signals each of said input means comprising a first transistor having a plurality of emitters;

first inverter means coupled to said first input means and responsive to input signals applied thereto, said first inverter means having a first output; second input means to receive input signals; second inverter means coupled to said second input means and responsive to input signals applied thereto, said second inverter means having a second output; cross-coupling means between said first output and said second input means and between said second output and said first input means, each cross-coupling means comprising a semiconductive active element coupled between said input means and a circuit point whose potential is directly responsive to said inverter means;

said active element of each of said cross-coupling means being a second transistor whose collector is coupled to the base of said first transistor, each of said inverter means comprising a third transistor whose base is connected to the collector of said first transistor and whose collector is connected to said circuit point.

2. The subject matter of claim 1 wherein: each of said inverter means also comprises an output signal level and polarity control network connected between said output, the emitter of said third transistor, and through a resistive buffer element to said circuit point.